United States Patent
Li et al.

(10) Patent No.: US 6,885,265 B2
(45) Date of Patent: Apr. 26, 2005

(54) HYBRID MODE STIRRED AND MODE TUNED CHAMBER

(75) Inventors: Erping Li, Singapore (SG); Sheng Wang, Singapore (SG); Daming Zhang, Singapore (SG)

(73) Assignee: Institute of High Performance Computing, Singapore (SG)

( * ) Notice: Subject to any disclaimer, the term of this patent is extended or adjusted under 35 U.S.C. 154(b) by 0 days.

(21) Appl. No.: 10/230,644

(22) Filed: Aug. 29, 2002

(65) Prior Publication Data

US 2003/0184417 A1 Oct. 2, 2003

(30) Foreign Application Priority Data

Mar. 28, 2002 (SG) ..................................... 200201886-9

(51) Int. Cl.⁷ ................................................ H01P 7/06
(52) U.S. Cl. ...................... 333/227; 333/232; 343/703
(58) Field of Search ................................ 333/227, 232, 333/231; 379/26.01; 324/637, 95; 343/703, 786

(56) References Cited

U.S. PATENT DOCUMENTS

| | | | | |
|---|---|---|---|---|
| 4,797,681 A | * | 1/1989 | Kaplan et al. | 343/786 |
| 5,530,412 A | * | 6/1996 | Goldblum | 333/232 |
| 5,631,661 A | * | 5/1997 | Sanchez | 343/703 |
| 5,982,331 A | * | 11/1999 | Podgorski | 343/703 |
| 6,437,748 B1 | * | 8/2002 | Burnside et al. | 343/703 |
| 6,519,321 B1 | * | 2/2003 | Swale | 379/26.01 |
| 6,556,023 B1 | * | 4/2003 | Okazaki | 324/637 |
| 6,580,783 B1 | * | 6/2003 | Swale | 379/26.01 |

* cited by examiner

*Primary Examiner*—Patrick Wamsley
(74) *Attorney, Agent, or Firm*—Hogan & Hartson, LLP

(57) ABSTRACT

First and second electrically conductive rods are provided inside a shielded electromagnetic test chamber. These rods are energized to radiate electromagnetic energy inside the chamber. The rods are mounted inside the chamber at right angles to one another, the first rod is movable through the interior volume in a first direction perpendicular to its long axis, and the second rod is movable through the chamber in a second direction perpendicular both to its own long axis and to the first rod's direction of motion. Energy is supplied to the two rods in a way that enhances the uniformity of the electromagnetic field applied to a working volume inside the chamber as the two rods move through the chamber.

55 Claims, 3 Drawing Sheets

HYBRID MODE STIRRED AND MODE TUNED CHAMBER

BACKGROUND OF THE INVENTION

The invention relates generally to electromagnetic field testing. More particularly, the invention provides improved mode stirred electromagnetic field test chambers and associated methods for electromagnetic field testing in such chambers.

Mode stirred chambers are used for testing electromagnetic compatibility of electronic devices and the susceptibility of electronic devices to electromagnetic radiation found in the devices' operating environments. In such testing, it is necessary to isolate the equipment being tested from electromagnetic fields that would otherwise be present in the test environment, so that electromagnetic fields can be applied to the equipment under test (EUT) in a controlled way. The performance of the EUT can then be assessed based on the known electromagnetic fields that are applied to it.

Isolation chambers have been used to shield EUT from external electromagnetic fields. Such chambers include electrically conductive enclosures that shield EUT inside the enclosure from electromagnetic radiation present outside the enclosure. This allows known electromagnetic fields radiated inside the chamber to be applied to the EUT in a controlled way in isolation from unknown and variable electromagnetic fields present outside the test environment.

Known isolation chambers have been equipped with irregularly shaped, mechanically rotatable metal "paddle wheels" inside the chamber. As electromagnetic fields are generated and radiated inside the chamber, the paddle wheel is rotated, which alters the boundary conditions and transmission characteristics inside the chamber. The paddle wheel is thus said to "stir" the electromagnetic fields inside the test chamber, and such chambers are frequently referred to as "mode stirred" test chambers.

Such mechanically mode stirred test chambers have found wide use, both in testing electronic equipment for susceptibility to outside interference; and in measuring electromagnetic radiation radiated by the devices themselves. Known chambers are less than ideal, however, particularly for testing for electromagnetic radiation at relatively low frequencies.

Conventional mode stirred chambers need to have dimensions of the same order as the wavelengths of the electromagnetic energy applied during the test. In some cases, though, it was desirable to test equipment at low frequencies at which the wave-length is on the order of several hundred yards, or more. It is obviously not generally feasible to build a test chamber of anything near this size.

A need exists, therefore, for electromagnetic field test chambers and associated testing methods in which controlled and uniform electromagnetic fields can be applied to EUT, and particularly at relatively low frequencies. Such chambers should be of reasonable size, and should not be unduly complex, either in their construction or in their operation.

SUMMARY OF THE INVENTION

The invention resides in a novel electromagnetic test chamber. The chamber includes an electromagnetic shield that defines an interior volume for the conduction of electromagnetic field exposure and radiation testing. An electrically conductive rod is provided inside the interior volume. The rod can be energized to generate electromagnetic radiation inside the interior volume, and moved through the interior volume to change the characteristics of the electromagnetic field over a working volume inside the electromagnetic shield. In preferred embodiments, the energy applied to the rod is controlled in a manner that enhances uniformity of the electromagnetic energy within the working volume as the rod moves through the interior volume. Some embodiments will include a paddle stirrer inside the interior volume of the chamber, to further stir and modify the electromagnetic field inside the chamber.

Preferred embodiments will include a second electrically conductive rod inside the chamber, and apparatus operable to energize that rod as well as the first one. In a particularly preferred embodiment, the first and second rods are mounted inside the chamber at right angles to one another, the first rod is movable through the interior volume in a first direction that is perpendicular to its long axis, and the second rod is movable through the chamber in a second direction that is perpendicular both to its own long axis and to the first rod's direction of motion. In that embodiment, the apparatus that energizes the rods controls the energy supplied to the two rods so as to enhance the uniformity of the electromagnetic field applied to a working volume inside the chamber as the two rods move through the chamber.

The first and second rods may be energized by apparatus that includes a signal generator, and the rods may be moved through the chamber by apparatus that includes a control motor. In the preferred embodiment, the first and second rods are movable but mechanically coupled at both ends to the walls of the chamber.

DESCRIPTION OF THE PREFERRED EMBODIMENTS

Figure 1:
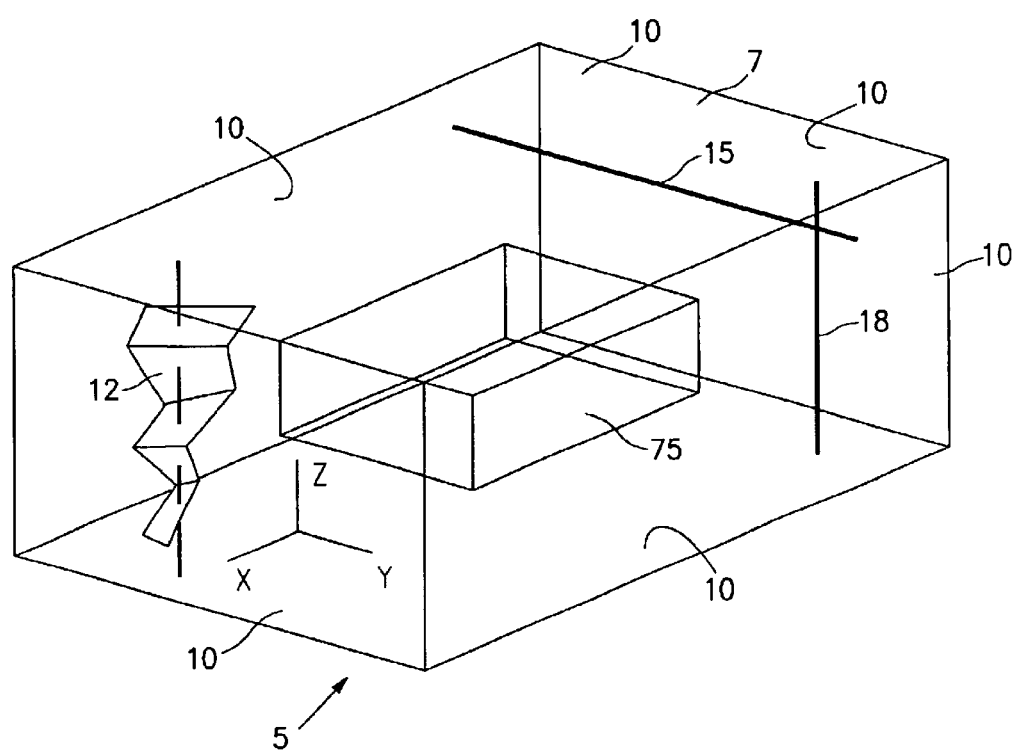
FIG. 1 is a schematic drawing illustrating an electromagnetic test chamber.

FIG. 1 is a schematic drawing illustrating an electromagnetic test chamber 5 according to the present invention. The test chamber includes an enclosure 7, which includes walls 10 situated to enclose an interior volume.

The walls of the test chamber are formed of aluminum or another material that isolates the interior volume from the exterior environment, so that the enclosure serves as an electromagnetic reverberation chamber suitable for testing electronic devices for susceptibility to external electromagnetic radiation. Such a chamber may also be used to measure the extent to which an electronic device leaks or emits electromagnetic radiation into the environment.

A twisted Z-shaped paddle stirrer 12 is located inside the test chamber 5, near one of the chamber's corners. The paddle stirrer rotates to change boundary conditions and thereby to "stir" electromagnetic fields present inside the test chamber. For high frequency electromagnetic radiation, the stirrer provides mode shifts and boundary condition changes sufficient to effectively randomize conditions inside the chamber, which is necessary for effective tests and accurate measurements. For lower frequency electromagnetism, though, the stirrer is not capable of effectively stirring the fields, and so other structures are desirable to improve the effectiveness of the chamber for low frequency tests.

The embodiment illustrated in FIG. 1 includes a first electrically conductive rod 15 inside the test chamber 5. In this embodiment, the first rod has a long axis that is horizontal, and the rod itself is movable horizontally, in a direction perpendicular to the rod's long axis, down the length of the chamber. A second electrically conductive rod 18 has a long axis that is vertical, with this rod movable horizontally across the chamber in a direction perpendicular to the first rod's direction of motion. The first rod is movable along the X-axis indicated in this figure, with the second rod movable in the Y-axis.

Figure 2:
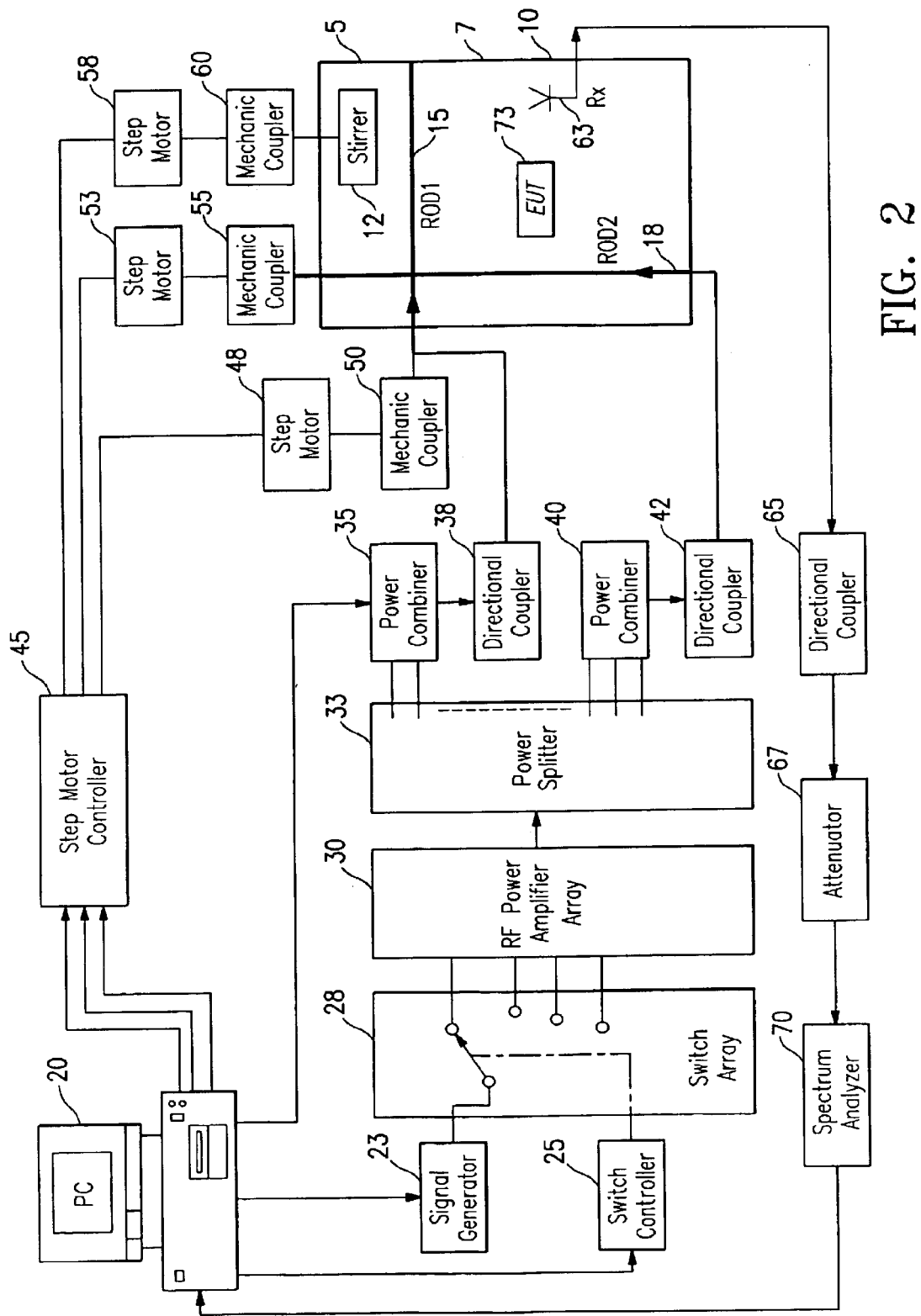
FIG. 2 is a schematic illustration of the working elements of the test chamber of FIG. 1.

FIG. 2 is a schematic illustration of the working elements of the test chamber 5 of FIG. 1. In this preferred embodiment, the system is controlled by an appropriately programmed computer 20, which may be, for example, a personal computer or another general purpose digital computer. A signal generator 23 provides a test source signal whose frequency, amplitude, and phase can be controlled in response to commands from the computer. A switch controller 25 drives a switch array 28 to provide the signal from the signal generator to a radio frequency power amplifier array 30.

The amplified signal is sent from the RF power amplifier array 30 to a power splitter 33, which splits the amplified signal. Part of the amplified signal is sent to a first power combiner 35 and a first directional coupler 38. These are electrically connected to the first rod 15 inside the enclosure 7 of the test chamber 5. Another part of the amplified signal goes to a second power combiner 40 and a second directional coupler 42, which are electrically connected to the second rod 18. The first and second rods are thus energized at the source signal frequency by the amplified signals supplied through the first and second directional couplers. Each of the rods is terminated by its own characteristic impedance, and the signals are fed into the rods by coaxial lines. Motion of the two rods 15 and 18 along the walls of the test chamber 5 will change the rods' characteristic impedances. To counter this, one might connect a DC-controlled varactor and a resistor in series with each rod to achieve proper load matching at the cost of some additional expense and structural complexity.

As an alternative, one may adjust the input power to compensate against the reflected power. To maintain constant net input power, the forward power can be adjusted to compensate for the differing reflected power loss. The appropriate forward power can be determined for each rod position by reading the net input power for each position during calibration of the chamber.

A control motor controller 45 is controlled by the computer 20 to drive mechanical elements of the system. The control motor controller controls a first control motor 48. The first control motor is connected through a first mechanical coupler 50 to the first rod 15. The first control motor and the first mechanical coupler function as a first drive mechanism to drive the first rod along the length of the enclosure 7. A second control motor 53, again controlled by the control motor controller 45, is connected to the second rod 18 through a second mechanical coupler 55. The second control motor and second mechanical coupler thus operate as a second mechanism to drive the second rod across the width of the chamber. The control motor controller 45 also controls a third control motor, which acts through a third mechanical coupler 60 to drive rotation of the paddle stirrer 12.

The mechanical couplers 50 and 55 should be designed so that there is no electrical contact between the rods 15 and 18 and the control motors 48 and 53, the motors' bearing systems, or other parts external to the test chamber 5. This is to prevent radio frequency leakage from the rods to the outside of the test chamber.

The rods 15 and 18 should also be isolated electrically from the walls 10 of the test chamber 5. Because the rods move along the walls 10 of the enclosure 7, relatively long cables are required to feed signals to the rods. Low loss cable should be used to minimize losses in these long cables. These cables should be well-shielded, moreover, to keep the cables from radiating emissions as long wire antennas, which could affect field conditions inside the chamber.

A receiving antenna 63 is located inside the enclosure 7 to receive electromagnetic signals from inside the test chamber 5. The receiving antenna is connected through a third directional coupler 65 and an attenuator 67 to a spectrum analyzer 70. Signals received by the receiving antenna are sampled by the spectrum analyzer and supplied to the computer 20. These samples are then stored in the computer and thus available for further study.

To perform a test, the electronic device or other piece of equipment is placed on a test stand 73 inside the enclosure 7. The interior volume is energized by signals applied to the first a d second rods 15 and 18. This energizes not only the normal cavity modes of the chamber, but also a transverse electromagnetic mode (TEM) for each of the rods. This mode is transverse to the long axis of each rod. This TEM mode can be propagated without any cut-off frequency. Since the TEM mode field is transverse to the long axis of its rod, though, it is not possible to excite a random, isotropic field with only one rod. A second rod is used, therefore, to excite the field in a direction parallel to the long axis of the first rod.

In the preferred embodiment, at frequencies above about 150 MHz there are sufficient transverse electrical (TE) and transverse magnetic (TM) modes inside the test chamber 5 so that the field can be stirred adequately by rotation of the stirrer 12, acting alone. In this mode of operation, the chamber is operated as a conventional mode-stirred chamber. The first and second rods 15 and 18 are held in place and not excited. In this conventional mode, a double-ridged horn (not shown) is used to excite the chamber.

For testing at lower frequencies, the first and second rods 15 and 18 are energized by separate signals and driven mechanically in a series of steps along the x- and y-axes, respectively, of the test chamber 5 (see FIG. 1). Movement of the excited rods serves to stir the electric field inside the chamber. The field is also stirred electronically, by changing in a proper way the amplitudes or phases of excitation of each of the two rods as they move through the chamber.

The field may be stirred electronically in this way by changing the phase of the signals applied to the rods between sequential step movements of the rods across the chambers. For example, for each rod, the phase of the applied signal might be changed by a value equal to $\alpha$, where $\alpha=360°/(LUF/f)$, in which LUF is the conventional lowest frequency of the chamber, and f is the frequency of the input signal.

Such schemes use the electrical phase difference between the two input signals to simulate the effects of higher frequency signals. One might refer to such combinations of mechanical and electronic mode stirring as "hybridized"

mode stirring. Schemes other than the one described above could be devised as well. Advantageous combinations of changes to, e.g., the amplitudes or phases of excitation for each of the two rods can be determined by simulation results to produce fields of improved uniformity in all directions.

Figure 3:
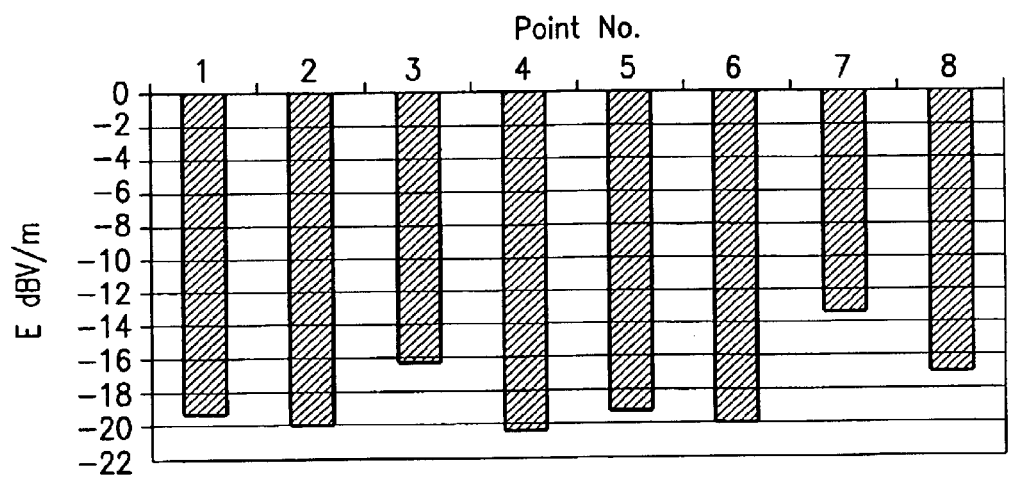
FIG. 3 illustrates simulated measurements of the maximum electromagnetic field under test conditions at various locations inside the test chamber of FIGS. 1 and 2.
Figure 4:
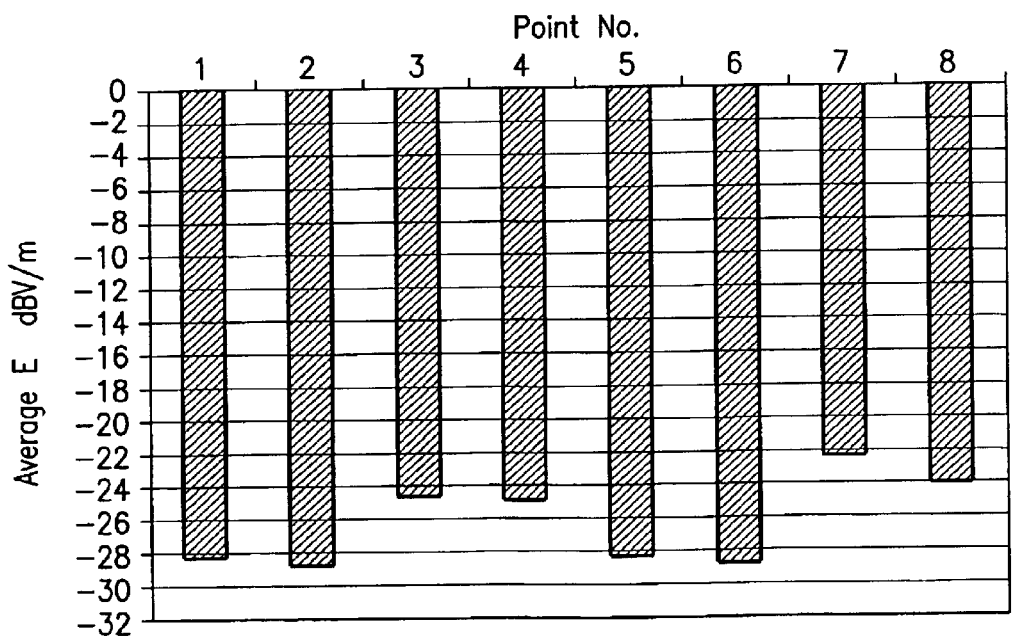
FIG. 4 illustrates simulated measurements of the average electromagnetic field under test conditions at various locations inside the test chamber of FIGS. 1 and 2.

In the embodiment of FIG. 1, a working volume 75 is created inside the test chamber 5. Inside this working volume, electromagnetic field conditions are sufficiently randomized and uniform to allow for acceptable testing, even at relatively low frequencies. FIGS. 3 and 4 illustrate conditions inside the chamber 5 for a simulated test conducted at 30 MHz. Referring again to FIG. 1, the working volume 75 inside the enclosure has eight corners. FIG. 3 illustrates simulated measurements of the maximum E-field at each of the eight corners as the rods 15 and 18 move and the stirrer rotates through a complete test. FIG. 4 illustrates simulated measurements of the average E-field at the eight corners under the same test conditions.

A preferred embodiment of the invention has been described in detail as an illustration above. Other embodiments are possible as well. As one example, an alternative embodiment could include a third rod with a long axis perpendicular to those of the other two. This might be expected to improve the performance of the test chamber somewhat, but this improvement would come at the cost of additional mechanical and control complexity. Such a change could be made, though, and might be desirable in some cases depending on the degree of field uniformity required.

Various other modifications, improvements, and additions may also be developed without deviating unduly from the invention's basic principles and the scope of the invention is certainly not limited to the exemplary embodiment described herein. The true scope of the invention should be determined primarily by reference to the appended claims, therefore, along with the full scope of equivalents to which those claims are legally and properly entitled.

What is claimed is:

1. An electromagnetic test chamber comprising:
   an electromagnetic shield defining an interior volume;
   a first conductive rod inside the interior volume;
   apparatus operable to energize the first conductive rod to generate electromagnetic radiation within the interior volume; and
   apparatus operable to move the first conductive rod through the interior volume.

2. The electromagnetic test chamber of claim 1, and further comprising:
   a second conductive rod inside the interior volume; and
   apparatus operable to energize the second conductive rod to generate electromagnetic radiation within the interior volume.

3. The electromagnetic test chamber of claim 2, wherein the apparatus operable to move the first conductive rod is operable to move the rod in a first direction, and further comprising apparatus operable to move the second conductive rod in a second direction different from the first direction.

4. The electromagnetic test chamber of claim 3, wherein the second rod has a long axis perpendicular to a long axis of the first rod.

5. The electromagnetic test chamber of claim 4, wherein the apparatus operable to move the first rod is operable to move the first rod in a first direction perpendicular to the long axis of the first rod and wherein the apparatus operable to move the second rod is operable to move the second rod in a second direction that is perpendicular to the long axis of the second rod and perpendicular to the direction of motion of the first rod.

6. The electromagnetic test chamber of claim 3, wherein the apparatus operable to energize the first conductive rod and the apparatus operable to energize the second conductive rod are operable to control energy applied to the first conductive rod and the second conductive rod to enhance uniformity of the electromagnetic energy generated within a working volume inside the test chamber as the first conductive rod and the second conductive rod move through the interior volume.

7. The electromagnetic test chamber of claim 3, wherein:
   the apparatus operable to move the first conductive rod through the interior volume is operable to move the first conductive rod in a series of sequential steps of the first rod;
   the apparatus operable to move the second conductive rod is operable to move the second conductive rod in a series of sequential steps of the second rod; and
   the apparatus operable to energize the first and second conductive rods is operable to change a phase of a signal applied to each of the rods between sequential steps of each rod, wherein the change of phase is equal to a phase angle α, where α=360°/(LUF/f), where LUF is the conventional lowest frequency of the chamber, and f is the frequency of the signal applied to each of the rods.

8. The electromagnetic test chamber of claim 1, wherein the apparatus operable to energize the first conductive rod comprises a signal generator electrically coupled to the first conductive rod.

9. The electromagnetic test chamber of claim 8, and further comprising apparatus operable to work with the signal generator to enhance uniformity of the electromagnetic radiation generated within the interior volume.

10. The electromagnetic test chamber of claim 1, wherein the first conductive rod has a long axis and the apparatus operable to move the first conductive rod is operable to move the rod in a direction perpendicular to its long axis.

11. The electromagnetic test chamber of claim 10, wherein the electromagnetic shield includes walls and wherein the first conductive rod has two ends mechanically coupled to the walls of the electromagnetic shield.

12. The electromagnetic test chamber of claim 1, wherein the apparatus operable to energize the first conductive rod is operable to control energy applied to the first conductive rod to enhance uniformity of the electromagnetic energy generated within a working volume inside the test chamber as the first conductive rod moves through the interior volume.

13. The electromagnetic test chamber of claim 1, and further comprising a paddle stirrer inside the interior volume.

14. The electromagnetic test chamber of claim 1, wherein the apparatus operable to move the first conductive rod includes a control motor.

15. An electromagnetic test chamber comprising:
   an electromagnetic shield defining an interior volume;
   a first conductive rod inside the interior volume;
   means for energizing the first conductive rod to generate electromagnetic radiation within the interior volume; and
   means for moving the first conductive rod through the interior volume.

16. The electromagnetic test chamber of claim 15, and further comprising:

a second conductive rod inside the interior volume; and means for energizing the second conductive rod to generate electromagnetic radiation within the interior volume.

17. The electromagnetic test chamber of claim 16, wherein the means for moving the first conductive rod is operable to move the rod in a first direction, and further comprising means for moving the second conductive rod in a second direction different from the first direction.

18. The electromagnetic test chamber of claim 17, wherein the second rod has a long axis perpendicular to a long axis of the first rod.

19. The electromagnetic test chamber of claim 18, wherein the means for moving the first rod is operable to move the first rod in a first direction perpendicular to the long axis of the first rod and wherein the means for moving the second rod is operable to move the second rod in a second direction that is perpendicular to the long axis of the second rod and perpendicular to the direction of motion of the first rod.

20. The electromagnetic test chamber of claim 17, wherein means for energizing the first conductive rod and the means for energizing the second conductive rod are operable to control energy applied to the first conductive rod and the second conductive rod to enhance uniformity of the electromagnetic energy generated within a working volume inside the test chamber as the first conductive rod and the second conductive rod move through the interior volume.

21. The electromagnetic test chamber of claim 17, wherein:

the means for moving the first conductive rod is operable to move the first conductive rod in a series of sequential steps of the first rod;

the means for moving the second conductive rod is operable to move the second conductive rod in a series of sequential steps of the second rod; and the means for energizing the first and second conductive rods is operable to change a phase of a signal applied to each of the rods between sequential steps of each rod, wherein the change of phase is equal to a phase angle $\alpha$, where $\alpha=360°/(LUF/f)$, where LUF is the conventional lowest frequency of the chamber, and f is the frequency of the signal applied to each of the rods.

22. The electromagnetic test chamber of claim 15, wherein the means for energizing the first conductive rod comprises a signal generator electrically coupled to the first conductive rod.

23. The electromagnetic test chamber of claim 22, and further comprising apparatus operable to work with the signal generator to enhance uniformity of the electromagnetic radiation generated within the interior volume.

24. The electromagnetic test chamber of claim 15, wherein the first conductive rod has a long axis and the means for moving the first conductive rod is operable to move the rod in a direction perpendicular to its long axis.

25. The electromagnetic test chamber of claim 24, wherein the electromagnetic shield includes walls and wherein the first conductive rod has two ends mechanically coupled to the walls of the electromagnetic shield.

26. The electromagnetic test chamber of claim 15, wherein the means for energizing the first conductive rod is operable to control energy applied to the first conductive rod to enhance uniformity of the electromagnetic energy generated within a working volume inside the test chamber as the first conductive rod moves through the interior volume.

27. The electromagnetic test chamber of claim 15, and further comprising a paddle stirrer inside the interior volume.

28. The electromagnetic test chamber of claim 15, wherein the means for moving the first conductive rod includes a control motor.

29. An electromagnetic test chamber comprising:

an electromagnetic shield defining an interior volume;

a paddle wheel electromagnetic field stirrer inside the interior volume of the electromagnetic shield;

a first conductive rod inside the interior volume, the first conductive rod having a long axis;

apparatus operable to energize the first conductive rod to generate electromagnetic radiation within the interior volume;

apparatus operable to move the first conductive rod through the interior volume;

a second conductive rod inside the interior volume, the second conductive rod having a long axis that is not parallel to the long axis of the first conductive rod;

apparatus operable to energize the second conductive rod to generate electromagnetic radiation within the interior volume; and apparatus operable to move the second conductive rod through the interior volume.

30. The electromagnetic test chamber of claim 29, wherein the second rod has a long axis perpendicular to a long axis of the first rod.

31. The electromagnetic test chamber of claim 30, wherein the apparatus operable to move the first rod is operable to move the first rod in a first direction perpendicular to the long axis of the first rod and wherein the apparatus operable to move the second rod is operable to move the second rod in a second direction perpendicular to the long axis of the second rod and perpendicular to the direction of motion of the first rod.

32. The electromagnetic test chamber of claim 29, wherein the apparatus operable to energize the first conductive rod and the apparatus operable to energize the second conductive rod are operable to enhance uniformity of the electromagnetic energy generated within a working volume inside the test chamber as the first conductive rod and the second conductive rod move through the interior volume.

33. The electromagnetic test chamber of claim 29, wherein:

the apparatus operable to move the first conductive rod is operable to move the first conductive rod in a series of sequential steps of the first rod;

the apparatus operable to move the second conductive rod is operable to move the second conductive rod in a series of sequential steps of the second rod; and the apparatus operable to energize the first and second conductive rods is operable to change a phase of a signal applied to each of the rods between sequential steps of each rod, wherein the change of phase is equal to a phase angle $\alpha$, where $\alpha=360°/(LUF/f)$, where LUF is the conventional lowest frequency of the chamber, and f is the frequency of the signal applied to each of the rods.

34. The electromagnetic test chamber of claim 29, wherein the apparatus operable to move the first rod is operable to move the rod in a first direction and the apparatus operable to move the second rod is operable to move the second rod in a second direction different from the first direction.

35. The electromagnetic test chamber of claim 29, wherein the apparatus operable to move the first conductive rod includes a first control motor and the apparatus operable to move the second conductive rod includes a second control motor.

36. An electromagnetic test chamber comprising:
an electromagnetic shield defining an interior volume;
a paddle wheel electromagnetic field stirrer inside the interior volume of the electromagnetic shield;
a first conductive rod inside the interior volume, the first conductive rod having a long axis;
means for energizing the first conductive rod to generate electromagnetic radiation within the interior volume;
means for moving the first conductive rod through the interior volume;
a second conductive rod inside the interior volume, the second conductive rod having a long axis that is not parallel to the long axis of the first conductive rod;
means for energizing the second conductive rod to generate electromagnetic radiation within the interior volume; and
means for moving the second conductive rod through the interior volume.

37. The electromagnetic test chamber of claim 36, wherein the second rod has a long axis perpendicular to a long axis of the fist rod.

38. The electromagnetic test chamber of claim 37, wherein the means for moving the first rod is operable to move the fist rod in a first direction perpendicular to the long axis of the first rod and wherein the means for moving the second rod is operable to move the second rod in a second direction perpendicular to the long axis of the second rod and perpendicular to the direction of motion of the first rod.

39. The electromagnetic test chamber of claim 36, wherein the means for energizing the first conductive rod and the means for energizing the second conductive rod are operable to enhance uniformity of the electromagnetic energy generated within a working volume inside the test chamber as the first conductive rod and the second conductive rod move through the interior volume.

40. The electromagnetic test chamber of claim 36, wherein:
the means for moving the first conductive rod is operable to move the first conductive rod in a series of sequential steps of the first rod;
the means for moving the second conductive rod is operable to move the second conductive rod in a series of sequential steps of the second rod; and
the means for energizing the first and second conductive rods is operable to change a phase of a signal applied to each of the rods between sequential steps of each rod, wherein the change of phase is equal to a phase angle $\alpha$, where $\alpha=360°/(LUF/f)$, where LUF is the conventional lowest frequency of the chamber, and f is the frequency of the signal applied to each of the rods.

41. The electromagnetic test chamber of claim 36, wherein the means for moving the first rod is operable to move the rod in a first direction and the means for moving the second rod is operable to move the second rod in a second direction different from the first direction.

42. The electromagnetic test chamber of claim 36, wherein the means for moving the first conductive rod includes a first control motor and the means for moving the second conductive rod includes a second control motor.

43. A method for electromagnetic testing, the method comprising:
providing an electromagnetic shield defining an interior volume;
providing a first conductive rod inside the interior volume;
energizing the first conductive rod to generate electromagnetic radiation within the interior volume; and
moving the first conductive rod through the interior while the first conductive rod is energized.

44. The method of claim 43, and further comprising:
providing a second conductive rod inside the interior volume; and
energizing the second conductive rod to generate electromagnetic radiation within the interior volume.

45. The method of claim 44, and further comprising:
moving the first conductive rod in a first direction while the first conductive rod is energized; and
moving the second conductive rod in a second direction different from the first direction while the second conductive rod is energized.

46. The method of claim 45, and further comprising:
controlling energy applied to the first conductive rod and the second conductive rod to enhance uniformity of the electromagnetic energy generated within a working volume inside the test chamber as the first conductive rod and the second conductive rod move through the interior volume.

47. The method of claim 45, wherein:
moving the first conductive rod while the first conductive rod is energized includes moving the first conductive rod in a series of sequential steps;
moving the second conductive rod while the second conductive rod is energized includes moving the second conductive rod in a series of sequential steps; and
energizing the first and second conductive rods includes changing a phase of a signal applied to each of the rods between sequential steps of each rod, wherein the change of phase is equal to a phase angle $\alpha$, where $\alpha=360°/(LUF/f)$, where LUF is the conventional lowest frequency of the chamber, and f is the frequency of the signal applied to each of the rods.

48. The method of claim 45, and further comprising:
moving the first rod in a first direction perpendicular to long axis of the first rod while the first conductive rod is energized; and
moving the second rod in a second direction perpendicular to a long axis of the second rod and perpendicular to the direction of motion of the first rod while the second conductive rod is energized.

49. The method of claim 43, and further comprising controlling energy applied to the first conductive rod to enhance uniformity of the electromagnetic radiation generated within the interior volume.

50. The method of claim 43, and further comprising rotating a paddle stirrer inside the interior volume.

51. A method for electromagnetic testing, the method comprising:
providing an electromagnetic shield defining an interior volume;
providing a paddle wheel electromagnetic field stirrer inside the interior volume of the electromagnetic shield;
rotating the paddle wheel electromagnetic field stirrer inside the interior volume of the electromagnetic shield;
providing a first conductive rod inside the interior volume, the first conductive rod having a long axis;
energizing the first conductive rod to generate electromagnetic radiation within the interior volume;

moving the first conductive rod through the interior volume while the first conductive rod is energized;

providing a second conductive rod inside the interior volume, the second conductive rod having a long axis that is not parallel to the long axis of the first conductive rod;

energizing the second conductive rod to generate electromagnetic radiation within the interior volume; and moving the second conductive rod through the interior volume while the second conductive rod is energized.

52. The method of claim 51, and further comprising:

moving the first conductive rod in a first direction while the first conductive rod is energized; and moving the second conductive rod in a second direction different from the first direction while the second conductive rod is energized.

53. The method of claim 52, and further comprising:

moving the first rod in a first direction perpendicular to long axis of the first rod while the first conductive rod is energized; and moving the second rod in a second direction perpendicular to a long axis of the second rod and perpendicular to the direction of motion of the first rod while the second conductive rod is energized.

54. The method of claim 51, and further comprising controlling energy applied to the first conductive rod and the second conductive rod to enhance uniformity of the electromagnetic energy generated within a working volume inside the test chamber as the first conductive rod and the second conductive rod move through the interior volume.

55. The method of claim 51, wherein:

moving the first conductive rod includes moving the first conductive rod in a series of sequential steps while the first conductive rod is energized;

moving the second conductive rod includes moving the second conductive rod in a series of sequential steps while the second conductive rod is energized; and energizing the first and second conductive rods includes changing a phase of a signal applied to each of the rods between sequential steps of each rod, wherein the change of phase is equal to a phase angle $\alpha$, where $\alpha=360°/(LUF/f)$, where LUF is the conventional lowest frequency of the chamber, and f is the frequency of the signal applied to each of the rods.

* * * * *